(12) United States Patent
Hirayama (10) Patent No.: US 8,004,362 B2
(45) Date of Patent: Aug. 23, 2011

(54) GATE BIAS CIRCUIT

(75) Inventor: Tomohisa Hirayama, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/374,715

(22) PCT Filed: May 31, 2007

(86) PCT No.: PCT/JP2007/061053
§ 371 (c)(1),
(2), (4) Date: Nov. 23, 2009

(87) PCT Pub. No.: WO2008/023487
PCT Pub. Date: Feb. 28, 2008

(65) Prior Publication Data
US 2010/0097147 A1    Apr. 22, 2010

(30) Foreign Application Priority Data

Aug. 23, 2006  (JP) ................................. 2006-226554
May 22, 2007   (JP) ................................. 2007-135410

(51) Int. Cl.
*H03F 3/16* (2006.01)
(52) U.S. Cl. ........................ 330/277; 330/288
(58) Field of Classification Search .............. 330/277, 330/288; 323/315, 316
See application file for complete search history.

(56) References Cited

U.S. PATENT DOCUMENTS

| | | | | |
|---|---|---|---|---|
| 6,587,000 B2 * | 7/2003 | Oikawa | .......................... | 330/288 |
| 6,664,941 B2 * | 12/2003 | Itakura et al. | .................... | 345/89 |
| 6,714,081 B1 * | 3/2004 | Xu | ................................ | 330/296 |
| 6,831,518 B2 * | 12/2004 | Blankenship et al. | ........ | 330/288 |

FOREIGN PATENT DOCUMENTS

| | | |
|---|---|---|
| JP | 04-073961 A | 3/1992 |
| JP | 08-008264 A | 1/1996 |
| JP | 08-116222 A | 5/1996 |
| JP | 11-330096 A | 11/1999 |
| JP | 2000-036582 A | 2/2000 |
| JP | 2000-091504 A | 3/2000 |
| JP | 2000-269426 A | 9/2000 |
| JP | 2002-368117 A | 12/2002 |
| JP | 2004-078172 A | 3/2004 |
| JP | 2004-281467 A | 10/2004 |
| JP | 2004-327574 A | 11/2004 |
| WO | 99/67884 A1 | 12/1999 |

* cited by examiner

*Primary Examiner* — Henry K Choe
(74) *Attorney, Agent, or Firm* — Sughrue Mion, PLLC (57) ABSTRACT

Multiple unit transistors each having the same gate length are arranged in a gate-lengthwise direction to form a group of unit transistors. At least one unit transistor included in the group of unit transistors is used as a part of a gate bias circuit and acts as unit transistor (102) that is used for the bias circuit, and all of or part of the other unit transistors are connected in parallel and used as amplifier (101).

11 Claims, 12 Drawing Sheets

101 amplifiers    102 unit transistor    101 amplifiers

Fig. 1

101 amplifiers   102 unit transistor   101 amplifiers

Fig. 2

201 amplifiers    202 unit transistor

GATE BIAS CIRCUIT

TECHNICAL FIELD

The present invention relates to a gate bias circuit including a transistor, and more particularly to a gate bias circuit which corrects a variation in current caused by a shift in the threshold voltage of the transistor.

BACKGROUND ART

In communication terminals such as radio terminals in which there has been a rapid increase in growth, there is incorporated an electrical circuit that includes an amplifier. When a compound FET (Field Effect Transistor) is used as the amplifier used in the electrical circuit, particularly in the power amplifier and the like, a gate bias circuit arranged on the same chip as a multi-finger FET, that acts as an amplifier body and that is made of FETs having different sizes, is used instead of a resistive divider so that characteristics are improved at the time of high output.

When a configuration using a current mirror circuit as the gate bias circuit is used, a transistor used in the power amplifier body and a transistor used in the gate bias circuit must have the same characteristics. In compound FETs, however, there may occur a deviation in threshold voltage on the same chip. Thus, the value of current flowing in the amplifier is different from the design value. Further, since these variations in threshold voltage are not uniform, there occurs a variation in the value of current flowing in the amplifier between chips.

Thus, in order to avoid such variation, there has been proposed a method of arranging current transistors regularly and thereby forming a constant current generating circuit (for example, refer to WO 1999/067884 pamphlet).

Further, there has been proposed a method of using multiple transistors having the same gate length and the same gate width and thereby suppressing variation in characteristics between transistors (for example, refer to Japanese Patent Laid-Open No. 1996-116222).

Further, there has been proposed a method of defining the order of multiple transistors and arranging them in parallel so that the characteristics of paired transistors used as transistors of a differential amplifier are made equal (refer to Japanese Patent Laid-Open No. 1992-073961 and Japanese Patent No. 1996-008264).

However, with the method described in WO 1999/067884 pamphlet, the outer circumference of transistors arranged regularly in a shape of Sea of Gate (SOG) has great variation due to loading effects or the like.

The method described in Japanese Patent Laid-Open No. 1996-116222 does not describe the arrangement and layout of the transistors. Also, there is no description of a case where the number of transistors is one.

In the methods described in Japanese Patent Laid-Open No. 1992-073961 and Japanese Patent No. 1996-008264, a configuration for making the sizes of paired transistors equal is also needed; this configuration is not needed for constituting the present invention.

DISCLOSURE OF THE INVENTION

To address the above problem, the present invention has an object to provide a gate bias circuit which can supply stable current to an amplifier.

To achieve the above object, according to the present invention, multiple unit transistors each having the same gate length are arranged in a gate-lengthwise direction to form a group of unit transistors, and at least one unit transistor included in the group of unit transistors is used as a part of a gate bias circuit and acts as a monitor unit transistor used for the bias circuit, and all of or part of the other unit transistors are connected in parallel and are used as an amplifier.

The present invention is characterized in that the monitor unit transistor is positioned at a place other than both ends of the group of unit transistors.

The present invention is characterized in that the monitor unit transistor is positioned at the center of the group of unit transistors.

The present invention is characterized in that the monitor unit transistor is a transistor which follows the characteristic variation of the group of unit transistors comprising the amplifier.

The present invention is characterized in that: a source of the amplifier is connected to the ground, and a drain of the amplifier is connected to a power source; a source of the monitor unit transistor is connected to the ground, a gate and drain of the monitor unit transistor are connected, the drain is connected to a power source, the gate is connected via a resistor or an inductor to a gate of the amplifier; and the ratio between current flowing in the monitor unit transistor and current flowing in the amplifier is proportional to the ratio between the gate width of the monitor unit transistor and the gate width of the amplifier.

The present invention is characterized in that the drain of the monitor unit transistor and the power source are connected via a first resistor, and the current flowing in the monitor unit transistor is adjusted by varying the resistance value of the first resistor.

The present invention is characterized in that: a source of the amplifier is connected to the ground, a drain of the amplifier is connected to a power source, and a gate of the amplifier is connected via a resistor to the ground; the monitor unit transistor includes a first transistor with a source connected to the ground, a drain connected to a power source, and a gate connected via a resistor to the ground, the source of the first transistor being connected to the gate of the monitor unit transistor, the gate of the first transistor being connected to the drain of the monitor unit transistor, and also includes a second transistor with a source connected to the gate of the amplifier; the gate of the first transistor is connected to the gate of the second transistor, and the gate potential of the monitor unit transistor interlocks via the first transistor and the second transistor with the amplifier, and the ratio between current flowing in the monitor unit transistor and current flowing in the amplifier is proportional to the ratio between the gate width of the monitor unit transistor and the gate width of the amplifier.

The present invention is characterized in that the drain of the monitor unit transistor is connected via a second resistor to the power source, and the current flowing in the monitor unit transistor is adjusted by varying the resistance value of the second resistor.

The present invention is characterized in that: the source of the amplifier is connected to the ground, the drain of the amplifier is connected to a power source, and the gate of the amplifier is connected via a diode to the ground; the monitor unit transistor includes a third transistor with a source connected to the ground, and a drain connected to the ground, and a gate connected via a diode to the ground, the source of the third transistor being connected to the gate of the monitor unit transistor, the gate of the third transistor being connected to the drain of the monitor unit transistor, and also includes a fourth transistor with a source connected to the gate of the amplifier; the gate of the third transistor is connected to the gate of the fourth transistor, and the gate potential of the monitor unit transistor interlocks via the third transistor and the fourth transistor with the amplifier, and the ratio between current flowing in the monitor unit transistor and current flowing in the amplifier is proportional to the ratio between the gate width of the monitor unit transistor and the gate width of the amplifier.

The present invention is characterized in that the drain of the monitor unit transistor is connected via a third resistor to the power source, and the current flowing in the monitor unit transistor is adjusted by varying the resistance value of the third resistor.

The present invention is characterized in that a fifth transistor with a gate and drain connected to each other, and a source connected to the drain of the monitor unit transistor, and a sixth transistor with a source connected to the drain of the second transistor are included, and the drain of the fifth transistor is connected to a gate of the sixth transistor.

The present invention is characterized in that the gate and drain of the fifth transistor is connected via a fourth resistor to the power source, and the current flowing in the monitor unit transistor is adjusted by varying the resistance value of the fourth resistor.

According to the present invention having the above constitution, multiple unit transistors each having the same gate length are arranged in a gate-lengthwise direction to form a group of unit transistors, and at least one unit transistor included in the group of unit transistors is used as a part of a gate bias circuit and acts as a monitor unit transistor used for the gate bias circuit, and all of or part of the other unit transistors are connected in parallel and used as an amplifier.

Accordingly, the unit transistor used as a unit transistor for the gate bias circuit is used as a transistor which monitors characteristics of the amplifier body, i.e., used as a transistor which has a strong correlation with the current of the amplifier body in the gate bias circuit, whereby current can be supplied stably against a deviation in threshold voltage which occurs in the same chip.

As described above, the present invention has a constitution in which multiple unit transistors each having the same gate length are arranged in a gate-lengthwise direction to form a group of unit transistors, and at least one unit transistor included in the group of unit transistors is used as a part of a gate bias circuit and acts as a monitor unit transistor used for the bias circuit, and all of or part of the other unit transistors are connected in parallel and used as an amplifier. Thus, stable current can be supplied to the amplifier.

BEST MODE FOR CARRYING OUT THE INVENTION

Exemplary embodiments of the present invention will be described below with reference to the drawings.

First Exemplary Embodiment

Figure 1:
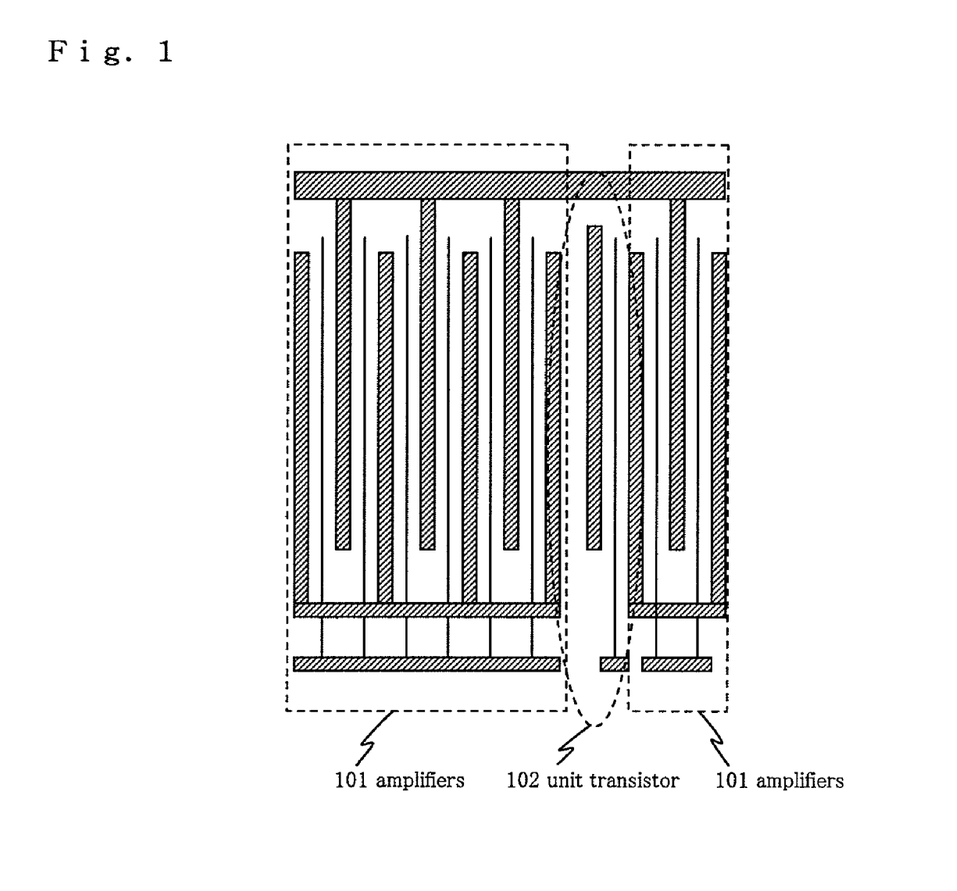
FIG. 1 is a view illustrating a first exemplary embodiment of a gate bias circuit according to the present invention.

FIG. 1 is a view illustrating a first exemplary embodiment of a gate bias circuit according to the present invention.

The present exemplary embodiment includes, as illustrated in FIG. 1, amplifiers 101 and unit transistor 102. Unit transistor 102 is a monitor unit transistor used for the gate bias circuit, being at least one unit transistor included in a group of unit transistors formed by arranging multiple unit transistors each having the same gate length in a gate-lengthwise direction. Amplifiers 101 are formed by connecting in parallel, unit transistors other than unit transistor 102, which are included in the group of unit transistors. In this case, all the unit transistors other than unit transistor 102 may be connected in parallel, or alternatively a part of the unit transistors other than unit transistor 102 may be connected in parallel.

In order to suppress a variation in amplifier current caused by a deviation in threshold voltage of the transistors on the same chip, unit transistor 102 is disposed at a place other than both ends of amplifiers 101. Typically, in a group of unit transistors constituted of unit transistors arranged in the gate-lengthwise direction, transistors at both the ends tend to have a great deviation in characteristics such as threshold values, as compared to the other transistors. Thus, when the transistors other than those at both ends are used as monitor unit transistor 102, a characteristic variation such as a threshold voltage deviation of amplifier 101 body is reflected in unit transistor 102. Accordingly, unit transistor 102 can play a role of monitoring characteristic variations of amplifiers 101. When this unit transistor 102 is used to form the gate bias circuit, it is possible to correct the variation in current flowing in amplifier 101 caused by a deviation in threshold voltage.

Second Exemplary Embodiment

Figure 2:
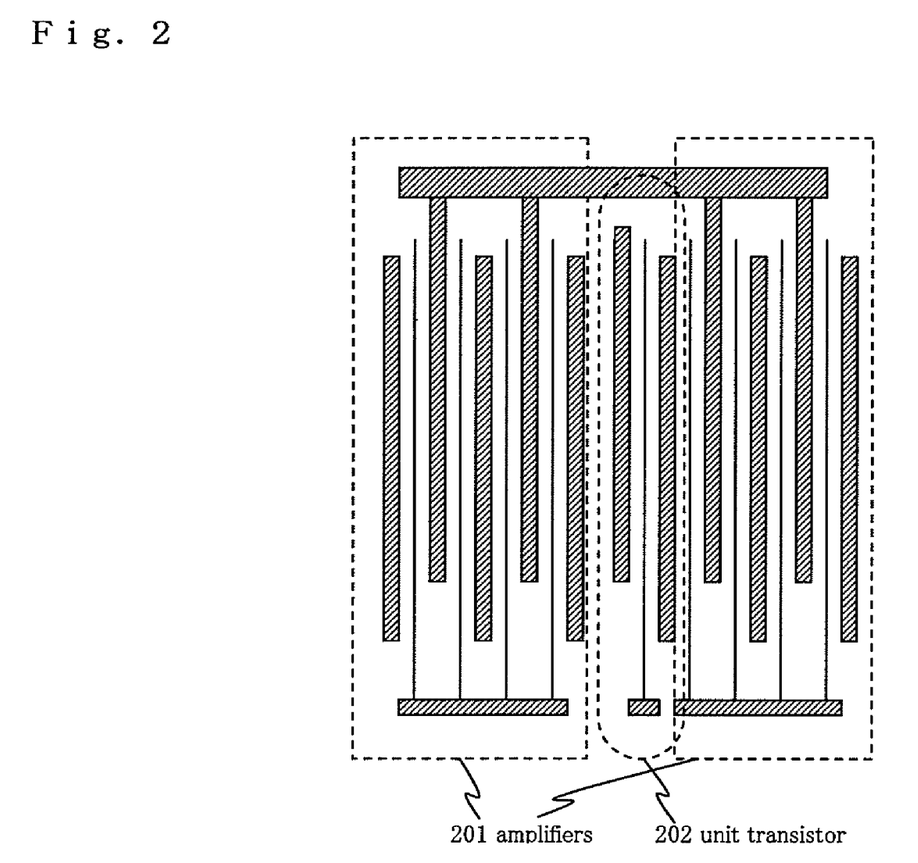
FIG. 2 is a view illustrating a second exemplary embodiment of the gate bias circuit according to the present invention.

FIG. 2 is a view illustrating a second exemplary embodiment of the gate bias circuit according to the present invention.

The present exemplary embodiment includes, as illustrated in FIG. 2, amplifiers 201 and unit transistor 202. Unit transistor 202 is a monitor unit transistor being at least one unit transistor included multiple unit transistors each having the same gate length in a group of unit transistors formed by arranging in a gate-lengthwise direction. Amplifiers 201 are formed by connecting in parallel, unit transistors other than unit transistor 202, which are included in the group of unit transistors described above. Unit transistor 202 is disposed in the vicinity of the center of the group of unit transistors, and used as a transistor for the gate bias circuit.

In the current FET process, multiple transistors fabricated in a small area of about 1 square millimeter on a chip may have different characteristics, particularly, different threshold voltages. The reasons for this include FET gate erosion and nonuniform barrier layer (spacer) thickness produced in the process of fabricating HJFET (Hetero Junction FET).

In order to suppress a variation in current flowing in the amplifier caused by a deviation in threshold voltage of the transistor on the same chip, unit transistor 202 is disposed in the vicinity of the center of amplifiers 201. As a result, a characteristic variation of amplifier 201 body caused by the layout or the process or the like is reflected on unit transistor 202. Accordingly, unit transistor 202 can play a role of monitoring the characteristic variation of amplifier 201. When this unit transistor 202 is used to form the gate bias circuit, it is possible to correct a variation in current flowing in amplifier 201 caused by a deviation in threshold voltage.

Third Exemplary Embodiment

Figure 3:
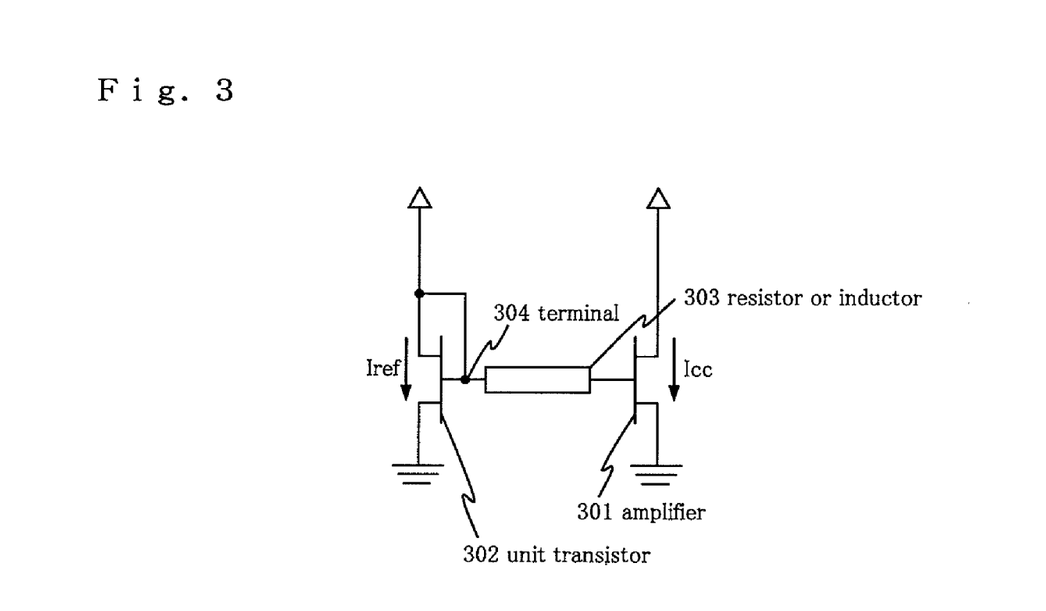
FIG. 3 is a view illustrating a third exemplary embodiment of the gate bias circuit according to the present invention.

FIG. 3 is a view illustrating a third exemplary embodiment of the gate bias circuit according to the present invention.

The present exemplary embodiment includes, as illustrated in FIG. 3, amplifier 301, unit transistor 302, resistor or inductor 303 and terminal 304. Amplifier 301 corresponds to amplifier 101 described in the first exemplary embodiment, or amplifier 201 described in the second exemplary embodiment. Unit transistor 302 corresponds to unit transistor 102 described in the first exemplary embodiment, or unit transistor 202 described in the second exemplary embodiment. The source of amplifier 301 and the source of unit transistor 302 used for the gate bias circuit are both connected to the ground. The gate and drain of unit transistor 302 are connected. Terminal 304 being the ground point is connected via resistor or inductor 303 to the gate of amplifier 301. Accordingly, the gate of amplifier 301 and the gate of unit transistor 302 have a common potential. Resistor or inductor 303 plays a role of providing a high impedance so that a high frequency signal flowing into the gate of amplifier 301 is prevented from leaking into unit transistor 302.

According to the present exemplary embodiment, when amplifier 301 has the same characteristics as unit transistor 302, and when a common gate voltage is used, the current flowing in amplifier 301 and the current flowing in unit transistor 302 are proportional to the gate width ratio between them. More specifically, when the current flowing in unit transistor 302 is Iref and the gate width of unit transistor 302 is Wg1 and the gate width of amplifier 301 is Wg2, and when the gate voltage is greater than threshold voltage Vt, the relationship between current Icc flowing in amplifier 301 and Iref is expressed as follows:

$$Icc/Iref=(Wg2/Wg1)$$

Therefore, when amplifier 301 has the same characteristics as unit transistor 302, Icc is determined by determining Iref.

Subsequently, it will be described how Icc is determined when the threshold voltage of amplifier 301 and the threshold voltage of unit transistor 302 deviate from designed threshold voltages. When it is assumed that the threshold voltage of amplifier 301 deviates by $\Delta Vth1$ from designed threshold voltage Vth and the threshold voltage of unit transistor 302 deviates by $\Delta Vth2$ from designed threshold voltage Vth, the relationship between Iref and Icc is expressed as follows:

$$Icc/Iref=(Wg2/Wg1)\times(Vg1-Vth-\Delta Vth2)/(Vg1-Vth-\Delta Vth1),$$

where Vg1 is a voltage value at terminal 304. The above formula indicates that, when $\Delta Vth1=\Delta Vth2$, i.e., when the same threshold voltage deviation occurs in amplifier 301 and unit transistor 302, if Iref is equal, current Icc flowing in amplifier 301 is stable against the threshold voltage deviation of amplifier 301 body.

As described above, in order to implement the designed characteristics, amplifier 301 and unit transistor 302 must have the same characteristics; this can be implemented by applying the first exemplary embodiment or second exemplary embodiment to the third exemplary embodiment.

Fourth Exemplary Embodiment

Figure 4:
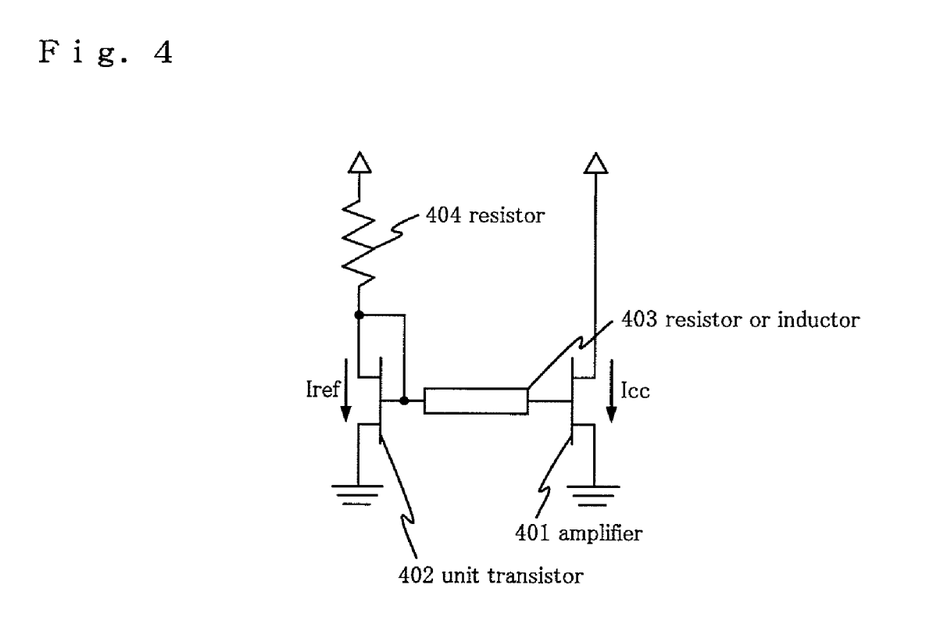
FIG. 4 is a view illustrating a fourth exemplary embodiment of the gate bias circuit according to the present invention.

FIG. 4 is a view illustrating a fourth exemplary embodiment of the gate bias circuit according to the present invention.

The present exemplary embodiment includes, as illustrated in FIG. 4, amplifier 401, unit transistor 402 being a monitor unit transistor, resistor or inductor 403 and resistor 404 being a first resistor. The difference between the present exemplary embodiment and the third exemplary embodiment is that resistor 404 is connected between the drain of unit transistor 402 and the power source terminal. Amplifier 401, unit transistor 402 and resistor or inductor 403 illustrated in FIG. 4 correspond to amplifier 301, unit transistor 302 and resistor or inductor 303 illustrated in FIG. 3, respectively.

When the adjustment voltage is Vref and the resistance value of resistor 404 is R, and when the internal resistance of unit transistor 402 is neglected, current Iref flowing in unit transistor 402 is expressed as follows:

$$Iref\approx(Vref-Vth)/R$$

for Vref>Vth

Current Iref flowing in unit transistor 402 can be regulated by adjusting this resistance value R of resistor 404. Thus, according to the fourth exemplary embodiment, when adjustment voltage Vref is fixed, the current value flowing in amplifier 401 can be changed to a desired value by regulating Iref according to the third exemplary embodiment.

Fifth Exemplary Embodiment

Figure 5:
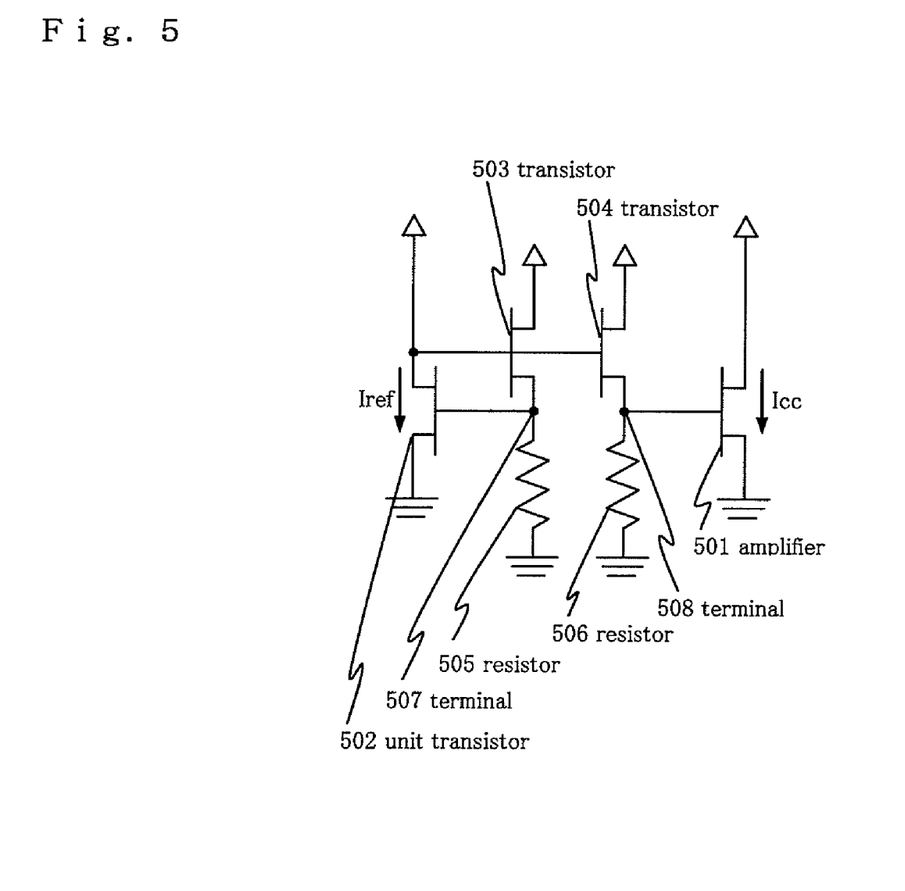
FIG. 5 is a view illustrating a fifth exemplary embodiment of the gate bias circuit according to the present invention.

FIG. 5 is a view illustrating a fifth exemplary embodiment of the gate bias circuit according to the present invention.

The present exemplary embodiment includes, as illustrated in FIG. 5, amplifier 501, unit transistor 502 being a monitor unit transistor, transistor 503 being a first transistor, transistor 504 being a second transistor, and resistors 505 and 506.

The gate of amplifier 501 and the source of transistor 504 are connected to each other at terminal 508, and terminal 508 is connected via resistor 506 to the ground. The gate of unit transistor 502 and the source of transistor 503 are connected to each other at terminal 507, and terminal 507 is connected via resistor 505 to the ground. The drain of unit transistor 502 is connected to the gate of transistor 503. The gate of transistor 503 is connected to the gate of transistor 504. Amplifier 501 and unit transistor 502 illustrated in FIG. 5 correspond to amplifier 301 and unit transistor 302 illustrated in FIG. 3, respectively.

According to the present exemplary embodiment, assuming that transistor 503 and transistor 504 are sufficiently smaller in size than amplifier 501, and have the same gate length and the same gate width, and are adjacent to each other, there is no characteristic difference between transistor 503 and transistor 504. Resistors 505 and 506 are resistors via which drain current flowing into transistors 503 and 504 is passed to the ground. Here, when the transistors are not FETs but bipolar transistors, these resistors are not needed because the collector current flows into the base of the amplifier and transistor. The present exemplary embodiment has such advantages in which, since the gate bias of amplifier 501 is a source follower, a high impedance is provided when the bias circuit is seen from the amplifier 501 side, so that an element such as resistor or inductor is not needed, and the saturation output power is greater in high frequency characteristics than when a resistor is used.

The operation according to the exemplary embodiment illustrated in FIG. 5 will be described below.

Since transistor 503 and transistor 504 have the same characteristics, a common gate potential is obtained, so that Vg1=Vg2, where the voltage of terminal 507 is Vg1 and the voltage of terminal 508 is Vg2. Thus, an operation similar to the operation according to the third exemplary embodiment is provided. More specifically, when the current flowing in unit transistor 502 is Iref and when the gate widths of amplifier 501 and unit transistor 502 are Wg1 and Wg2, respectively, the relationship between current Icc flowing in amplifier 501 and Iref is expressed as follows.

$$Icc/Iref = Wg2/Wg1$$

Subsequently, it will be described how Icc is determined when the threshold voltage of amplifier 501 and the threshold voltage of unit transistor 502 deviate from designed threshold voltages. When it is assumed that the threshold voltage of amplifier 501 deviates by ΔVth1 from designed threshold voltage Vth and that the threshold voltage of unit transistor 502 deviates by ΔVth2 from designed threshold voltage Vth, the relationship between Iref and Icc is expressed as follows:

$$Icc/Iref = (Wg2/Wg1) \times (Vg2 - Vth - \Delta Vth2)/(Vg1 - Vth - \Delta Vth1)$$

The above formula indicates that, suppose Vg1=Vg2, if ΔVth1=ΔVth2, i.e., if the same threshold voltage deviation occurs in amplifier 501 and unit transistor 502, when Iref is equal, current Icc flowing in amplifier 501 is stable against the threshold voltage deviation of amplifier 501 body.

As described above, in order to implement the designed characteristics, amplifier 501 and unit transistor 502 must have the same characteristics; this can be implemented by applying the first exemplary embodiment or second exemplary embodiment to the fifth exemplary embodiment. Even when the gate width of transistor 503 is not equal to that of transistor 504, the above formula holds, so the similar effect can be achieved.

Sixth Exemplary Embodiment

Figure 6:
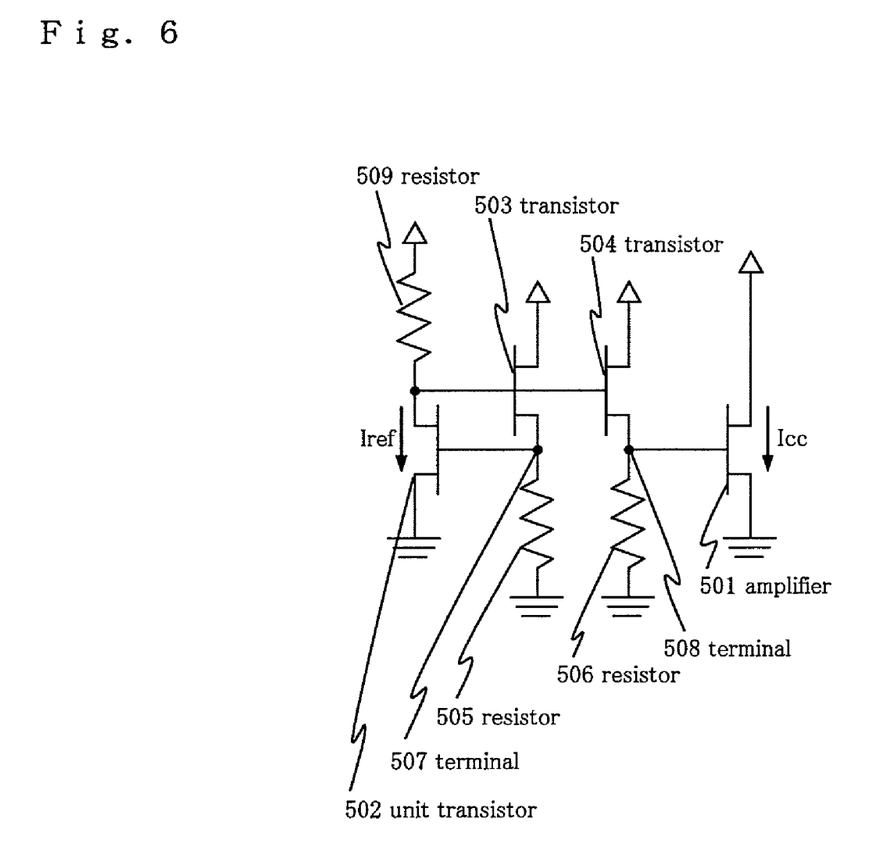
FIG. 6 is a view illustrating a sixth exemplary embodiment of the gate bias circuit according to the present invention.

FIG. 6 is a view illustrating a sixth exemplary embodiment of the gate bias circuit according to the present invention.

According to the present exemplary embodiment, as illustrated in FIG. 6, resistor 509 being a second resistor is connected between the drain of unit transistor 502 according to the fifth exemplary embodiment illustrated in FIG. 5 and the power source terminal.

When the adjustment voltage is Vref and the resistance value of resistor 509 is R, and when the internal resistance of unit transistor 502 is neglected, current Iref flowing in unit transistor 502 is expressed as follows:

$$Iref \approx (Vref - Vth)/R$$

for Vref>Vth

Current Iref flowing in unit transistor 502 can be regulated by adjusting this resistance value R of resistor 509. Thus, according to the sixth exemplary embodiment, when adjustment voltage Vref is fixed, the current value flowing in amplifier 501 can be changed to a desired value by regulating Iref according to the fifth exemplary embodiment.

Seventh Exemplary Embodiment

Figure 7:
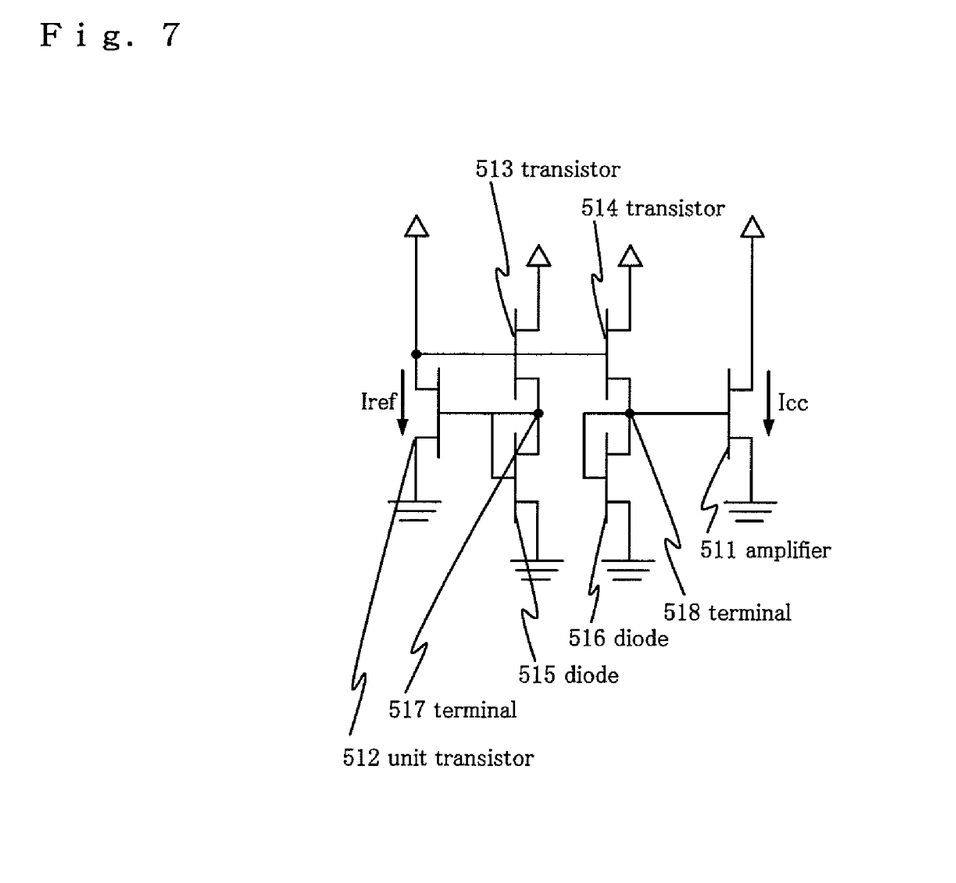
FIG. 7 is a view illustrating a seventh exemplary embodiment of the gate bias circuit according to the present invention.

FIG. 7 is a view illustrating a seventh exemplary embodiment of the gate bias circuit according to the present invention.

The present exemplary embodiment includes, as illustrated in FIG. 7, amplifier 511, unit transistor 512 being a monitor unit transistor, transistor 513 being a third transistor, transistor 514 being a fourth transistor, and resistors 515 and 516.

The gate of amplifier 511 and the source of transistor 514 are connected to each other at terminal 518, and terminal 518 is connected via diode 516 to the ground. The gate of unit transistor 512 and the source of transistor 513 are connected to each other at terminal 517, and terminal 517 is connected via diode 515 to the ground. The drain of unit transistor 512 is connected to the gate of transistor 513. The gate of transistor 513 is connected to the gate of transistor 514. Amplifier 511 and unit transistor 512 illustrated in FIG. 7 correspond to amplifier 301 and unit transistor 302 illustrated in FIG. 3, respectively.

According to the present exemplary embodiment, assuming that transistor 513 and transistor 514 are sufficiently smaller in size than amplifier 511, and have the same gate length and the same gate width, and are adjacent to each other, there is no difference in characteristics between transistor 513 and transistor 514. Diodes 515 and 516 are diodes through which drain current flowing into transistors 513 and 514 is passed to the ground. Here, resistors 505 and 506 are replaced with diodes 515 and 516, as compared to the fifth exemplary embodiment. Accordingly, it is possible to suppress the rise in gate voltage associated with the increase in input voltage which occurs when a resistor is used. Thus, the present configuration is more advantageous for an amplifier which is required to operate not in the saturation range but in the linear range. The operation according to the present exemplary embodiment is similar to that of the fifth exemplary embodiment, and hence an explanation thereof is omitted.

Eighth Exemplary Embodiment

Figure 8:
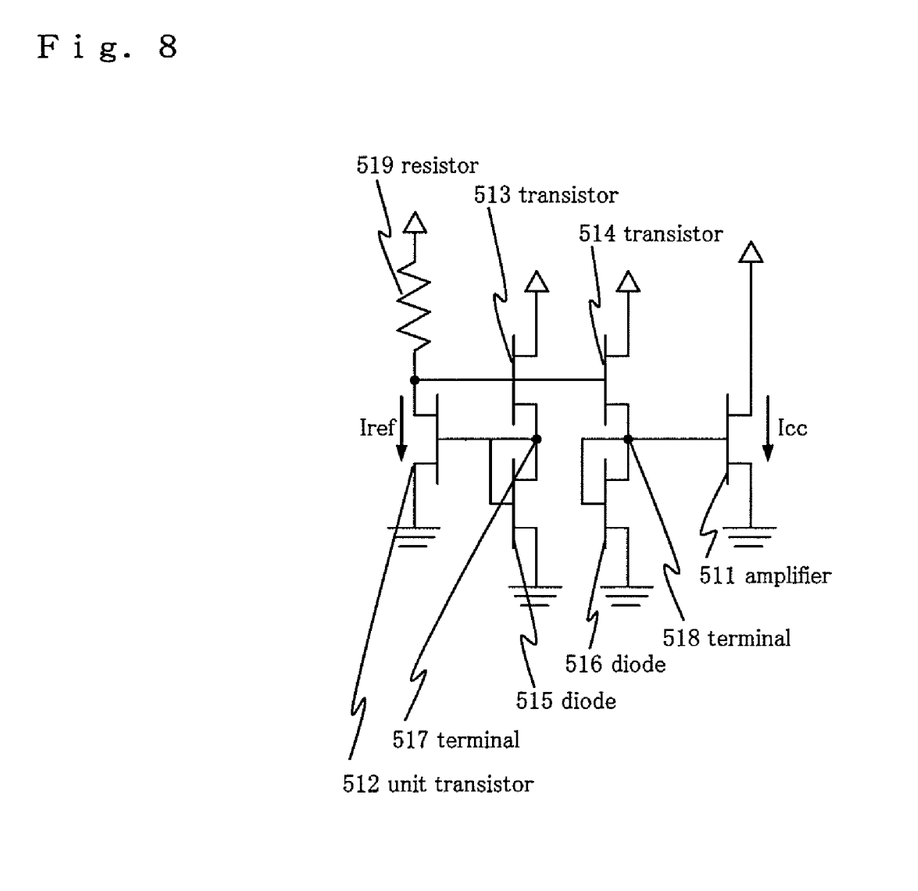
FIG. 8 is a view illustrating an eighth exemplary embodiment of the gate bias circuit according to the present invention.

FIG. 8 is a view illustrating an eighth exemplary embodiment of the gate bias circuit according to the present invention.

According to the present exemplary embodiment, as illustrated in FIG. 8, resistor 519 being a third resistor is connected between the drain of unit transistor 512 according to the seventh exemplary embodiment illustrated in FIG. 7 and the power source terminal.

When the adjustment voltage is Vref and the resistance value of resistor 519 is R, and when the internal resistance of unit transistor 512 is neglected, current Iref flowing in unit transistor 512 is expressed as follows:

$$Iref \approx (Vref - Vth)/R$$

for Vref>Vth

Current Iref flowing in unit transistor 512 can be regulated by adjusting this resistance value R of resistor 519. Thus, accord-

Ninth Exemplary Embodiment

Figure 9:
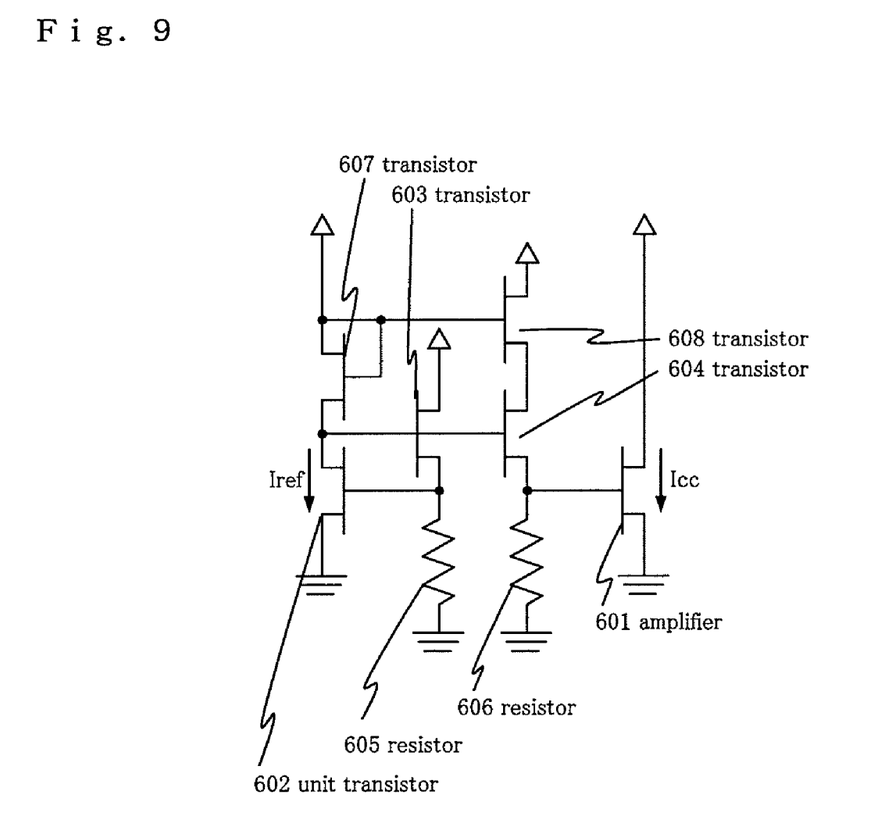
FIG. 9 is a view illustrating a ninth exemplary embodiment of the gate bias circuit according to the present invention.

FIG. 9 is a view illustrating a ninth exemplary embodiment of the gate bias circuit according to the present invention.

The present exemplary embodiment includes, as illustrated in FIG. 9, amplifier 601, unit transistor 602 being a monitor unit transistor, transistors 603, 604, 607 and 608, and resistors 605 and 606. According to the present exemplary embodiment, transistor 607 being a fifth transistor and transistor 608 being a sixth transistor are added to the configuration of the fifth exemplary embodiment. The gate and drain of transistor 607 are connected, and the source of transistor 607 is connected to the drain of unit transistor 602. The source of transistor 608 is connected to the drain of transistor 604, and the gate of transistor 608 is connected to the gate and drain of transistor 607. Amplifier 601, unit transistor 602, transistors 603 and 604 and resistors 605 and 606 illustrated in FIG. 9 correspond to amplifier 501, unit transistor 502, transistors 503 and 504 and resistors 505 and 506 illustrated in FIG. 5, respectively.

Transistor 607 plays a role of varying by Vth the voltage applied to the drain of unit transistor 602, and is used according to a power source voltage that is used.

Tenth Exemplary Embodiment

Figure 10:
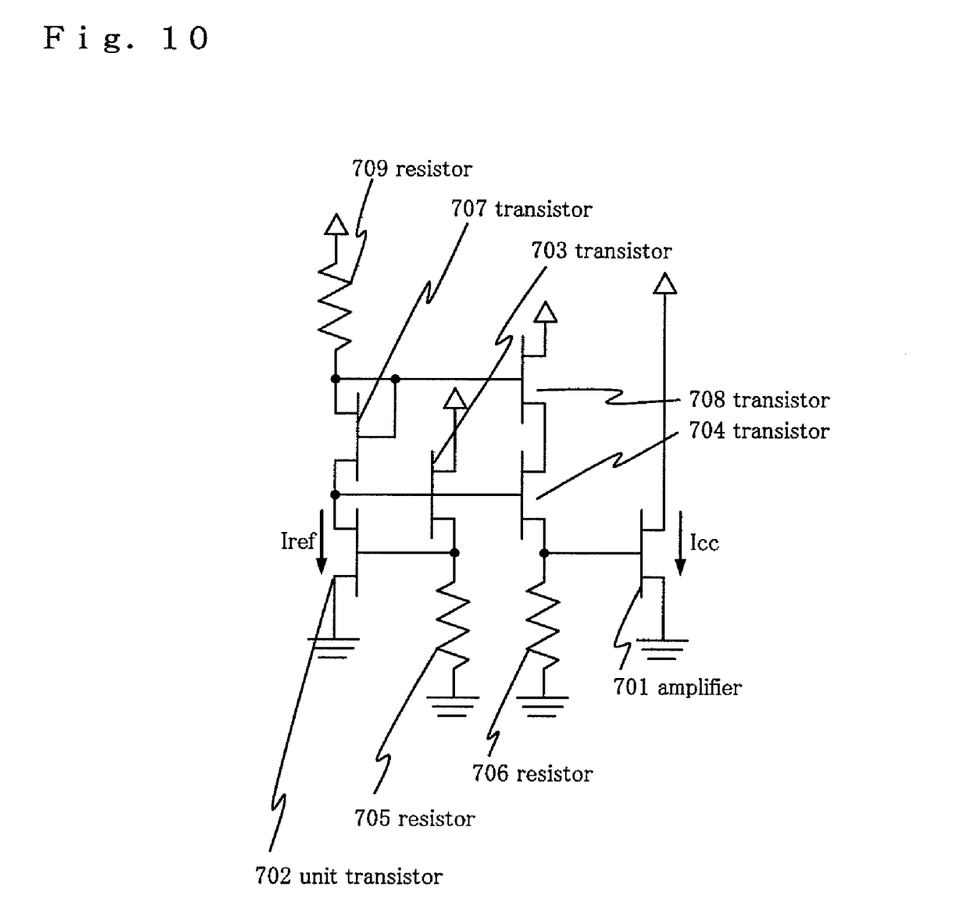
FIG. 10 is a view illustrating a tenth exemplary embodiment of the gate bias circuit according to the present invention.

FIG. 10 is a view illustrating a tenth exemplary embodiment of the gate bias circuit according to the present invention.

The present exemplary embodiment includes, as illustrated in FIG. 10, amplifier 701, unit transistor 702 being a monitor unit transistor, transistors 703, 704, 707 and 708, and resistors 705, 706 and 709. According to the present exemplary embodiment, resistor 709 being a fourth resistor is additionally connected between the drain of transistor 707 and the power source terminal, as compared to the ninth exemplary embodiment. Amplifier 701, unit transistor 702, transistors 703, 704, 707 and 708, and resistors 705 and 706 illustrated in FIG. 10 correspond to amplifier 601, unit transistor 602, transistors 603, 604, 607 and 608, and resistors 605 and 606 illustrated in FIG. 9, respectively.

When the adjustment voltage is Vref and the resistance value of resistor 709 is R, and when the internal resistance of unit transistor 702 and the internal resistance of transistor 707 are neglected, current Iref flowing in unit transistor 702 is expressed as follows:

$$Iref \approx (Vref - 2 \times Vth)/R$$

for Vref>2×Vth

Current Iref flowing in unit transistor 702 can be regulated by adjusting this resistance value R of resistor 709. Thus, the current value flowing in amplifier 701 can be changed to a desired value.

There will be described below the result of simulating whether a variation in current caused by a threshold voltage deviation can be corrected according to the tenth exemplary embodiment.

Figure 11:
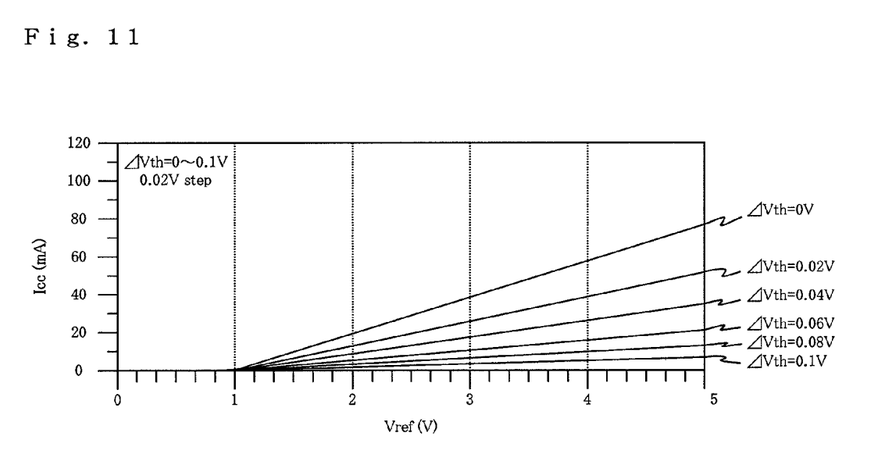
FIG. 11 is a view illustrating a result of simulating Vref-Icc characteristics when a threshold voltage deviation occurs in the amplifier body according to the tenth exemplary embodiment.

FIG. 11 is a view illustrating the result of simulating Vref-Icc characteristics when a threshold voltage deviation occurs in amplifier 701 according to the tenth exemplary embodiment. In this simulation, it is assumed that designed threshold voltage Vth is 0.4 V for amplifier 701, unit transistor 702 and transistors 703, 704, 707 and 708 (assuming that HJFETs are used).

According to the simulation result, as illustrated in FIG. 11, when the threshold voltage of amplifier 701 deviates by ΔVth (=0~0.1 V) from threshold voltage Vth of unit transistor 702 used in the bias circuit and transistors 703, 704, 707 and 708, current Icc flowing in amplifier 701 with respect to the adjustment voltage Vref deviates significantly from the value for designed threshold voltage Vth (ΔVth=0 V).

Figure 12:
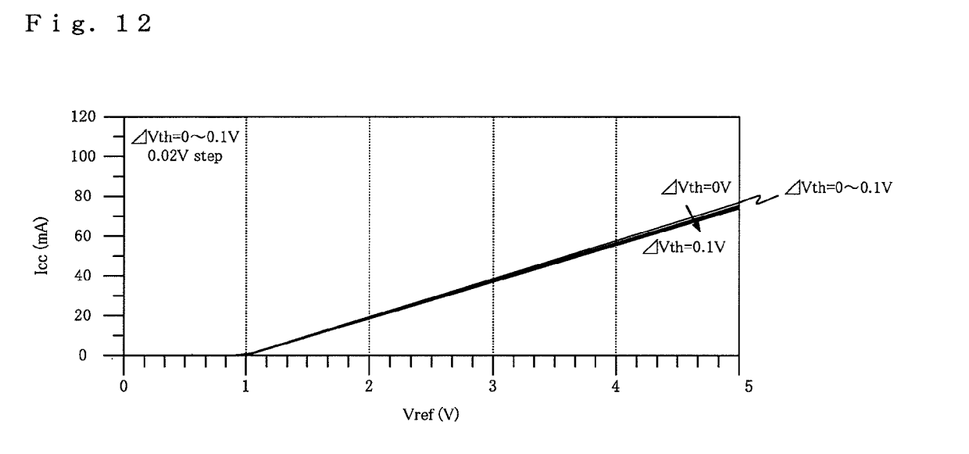
FIG. 12 is a view illustrating a result of simulating Vref-Icc characteristics when the threshold voltage deviation of amplifier 701 is equal to the threshold voltage deviation of unit transistor 702.

FIG. 12 is a view illustrating the result of simulating Vref-Icc characteristics when the threshold voltage deviation of amplifier 701 is equal to the threshold voltage deviation of unit transistor 702.

According to the simulation result, as illustrated in FIG. 12, when the threshold voltage of unit transistor 702 deviates by the same amount as threshold voltage deviation ΔVth of amplifier 701, current Icc flowing in amplifier 701 is stable. According to the present invention, amplifier 701 and unit transistor 702 are arranged in the layout as illustrated in the first or second exemplary embodiment. Thus, the threshold voltage of unit transistor 702 follows the threshold voltage deviation of amplifier 701, so the characteristics illustrated in FIG. 12 can be expected. Accordingly, stable current can be supplied to amplifier 701.

The previous description is of an exemplary embodiment in which an FET is used as the transistor. However, the similar effect can also be expected when a bipolar transistor is used.

The gate bias circuit according to the present invention can be used for a bias circuit provided in high frequency amplifiers used in mobile telephones and mobile terminals for wireless LAN.

The invention claimed is:

1. A gate bias circuit comprising:
   plurality of unit transistors each having the same gate length arranged in a gate-lengthwise direction to form a group of unit transistors, wherein:
   at least one unit transistor included in the group of unit transistors is used as a monitor unit transistor that is used for the gate bias circuit, and all of or part of the other unit transistors are connected in parallel and are used as an amplifier,
   a source of the amplifier is connected to the ground, and a drain of the amplifier is connected to a power source;
   a source of the monitor unit transistor is connected to the ground, a gate and drain of the monitor unit transistor are connected, the drain is connected to a power source, the gate is connected via a resistor or an inductor to a gate of the amplifier; and
   the ratio between current flowing in the motor unit transistor and current flowing in the amplifier is proportional to the ratio between the gate width of the monitor unit transistor and the gate width of the amplifier.

2. The gate bias circuit according to claim 1, wherein the monitor unit transistor is positioned at a place other than both ends of the group of unit transistors.

3. The gate bias circuit according to claim 2, wherein the monitor unit transistor is positioned at the center of the group of unit transistors.

4. The gate bias circuit according to claim 1, wherein the monitor unit transistor is a transistor which follows a variation in the characteristics of the group of unit transistors forming the amplifier.

5. The gate bias circuit according to claim 1, wherein the drain of the monitor unit transistor and the power source are connected via a first resistor, and the current flowing in the monitor unit transistor is adjusted by varying the resistance value of the first resistor.

6. A gate bias circuit comprising:

a plurality of unit transistors each having the same gate length arranged in a gate lengthwise direction to form a group of unit transistors, wherein at least one unit transistor included in the group of unit transistors is used as a monitor unit transistor that is used for the gate bias circuit, and all of or part of the other unit transistors are connected in parallel and are used as an amplifier, wherein:

a source of the amplifier is connected to the ground, a drain of the amplifier is connected to a power source, and a gate of the amplifier is connected via a resistor to the ground;

the monitor unit transistor includes a first transistor with a source connected to the ground, a drain connected to a power source, and a gate connected via a resistor to the ground, the source of the first transistor being connected to the gate of the monitor unit transistor, the gate of the first transistor being connected to the drain of the monitor unit transistor, and also includes a second transistor with a source connected to the gate of the amplifier;

the gate of the first transistor is connected to the gate of the second transistor, and the gate potential of the monitor unit transistor interlocks via the first transistor and the second transistor with the amplifier, and the ratio between current flowing in the monitor unit transistor and current flowing in the amplifier is proportional to the ratio between the gate width of the monitor unit transistor and the gate width of the amplifier.

7. The gate bias circuit according to claim 6, wherein the drain of the monitor unit transistor is connected via a second resistor to the power source, and the current flowing in the monitor unit transistor is adjusted by varying the resistance value of the second resistor.

8. A gate bias circuit comprising:

a plurality of unit transistors each having the same gate length arranged in a gate lengthwise direction to form a group of unit transistors, wherein at least one unit transistor included in the group of unit transistors is used as a monitor unit transistor that is used for the gate bias circuit, and all of or part of the other unit transistors are connected in parallel and are used as an amplifier, wherein:

the source of the amplifier is connected to the ground, the drain of the amplifier is connected to a power source, and the gate of the amplifier is connected via a diode to the ground;

the monitor unit transistor includes a third transistor with a source connected to the ground, a drain connected to the ground, and a gate connected via a diode to the ground, the source of the third transistor being connected to the gate of the monitor unit transistor, the gate of the third transistor being connected to the drain of the monitor unit transistor, and also includes a fourth transistor with a source connected to the gate of the amplifier;

the gate of the third transistor is connected to the gate of the fourth transistor, and the gate potential of the monitor unit transistor interlocks via the third transistor and the fourth transistor with the amplifier, and the ratio between current flowing in the monitor unit transistor and current flowing in the amplifier is proportional to the ratio between the gate width of the monitor unit transistor and the gate width of the amplifier.

9. The gate bias circuit according to claim 8, wherein the drain of the monitor unit transistor is connected via a third resistor to the power source, and the current flowing in the monitor unit transistor is adjusted by varying the resistance value of the third resistor.

10. The gate bias circuit according to claim 6, wherein a fifth transistor with a gate and drain connected to each other, and a source connected to the drain of the monitor unit transistor, and a sixth transistor with a source connected to the drain of the second transistor are included, and the drain of the fifth transistor is connected to a gate of the sixth transistor.

11. The gate bias circuit according to claim 10, wherein the gate and drain of the fifth transistor is connected via a fourth resistor to the power source, and the current flowing in the monitor unit transistor is adjusted by varying the resistance value of the fourth resistor.

* * * * *

UNITED STATES PATENT AND TRADEMARK OFFICE
CERTIFICATE OF CORRECTION

PATENT NO. : 8,004,362 B2
APPLICATION NO. : 12/374715
DATED : August 23, 2011
INVENTOR(S) : Tomohisa Hirayama It is certified that error appears in the above-identified patent and that said Letters Patent is hereby corrected as shown below:

In the Specification

Column 6, Line 37: delete "$\approx$" and insert -- $\fallingdotseq$ --

Column 8, Line 1: delete "$\approx$" and insert -- $\fallingdotseq$ --

Column 8, Line 63: delete "$\approx$" and insert -- $\fallingdotseq$ --

Column 9, Line 52: delete "$\approx$" and insert -- $\fallingdotseq$ --

In the Claims

Column 10, Line 52: In Claim 1, delete "motor" and insert -- monitor --

Signed and Sealed this
Thirtieth Day of September, 2014

Michelle K. Lee
*Deputy Director of the United States Patent and Trademark Office*